(12) United States Patent
Waters et al.

(10) Patent No.: US 11,388,837 B2
(45) Date of Patent: Jul. 12, 2022

(54) SYSTEMS AND METHODS OF FORMING A BACKPLANE AIRFLOW GUIDE

(71) Applicant: Dell Products, LP, Round Rock, TX (US)

(72) Inventors: Paul A. Waters, Austin, TX (US); Jean M. Doglio, Austin, TX (US); Evangelos Koutsavdis, Leander, TX (US)

(73) Assignee: Dell Products, LP, Round Rock, TX (US)

( * ) Notice: Subject to any disclaimer, the term of this patent is extended or adjusted under 35 U.S.C. 154(b) by 81 days.

(21) Appl. No.: 17/031,714

(22) Filed: Sep. 24, 2020

(65) Prior Publication Data
US 2022/0095480 A1    Mar. 24, 2022

(51) Int. Cl.
*H05K 7/20* (2006.01)
*G10K 11/16* (2006.01)
*G11B 33/12* (2006.01)
*G11B 33/08* (2006.01)

(52) U.S. Cl.
CPC ......... *H05K 7/20145* (2013.01); *G10K 11/16* (2013.01); *G11B 33/126* (2013.01); *H05K 7/20736* (2013.01)

(58) Field of Classification Search
CPC . G06F 1/20; G06F 1/187; G06F 1/206; G06F 1/181; G06F 2200/201; G06F 3/0604; G11B 33/142; G11B 33/128; G11B 33/08; H05K 7/20736; H05K 7/20145; H05K 7/1487; H05K 7/20754; H05K 7/20572; H05K 7/20818; H05K 7/20; G10K 11/172; G10K 11/161; G10K 11/162
USPC .... 361/695, 679.33, 679.48, 679.31, 679.51, 361/679.5; 165/104.33; 360/97.13, 99.14
See application file for complete search history.

(56) References Cited

U.S. PATENT DOCUMENTS

| | | | |
|---|---|---|---|
| 6,636,379 B2 | 10/2003 | Rannow | |
| 9,241,427 B1 | 1/2016 | Stevens | |
| 9,574,791 B2 | 2/2017 | Lind | |
| 10,331,183 B1 | 6/2019 | Lotter | |
| 10,565,974 B1* | 2/2020 | Bhatia | G11B 33/08 |
| 2017/0160771 A1 | 6/2017 | Albrecht | |
| 2018/0182439 A1 | 6/2018 | Asai | |
| 2018/0247677 A1 | 8/2018 | Eguchi | |

(Continued)

FOREIGN PATENT DOCUMENTS

WO    2017/132389 A1    8/2017

*Primary Examiner* — Mandeep S Buttar
(74) *Attorney, Agent, or Firm* — Prol Intellectual Property Law, PLLC; H. Kenneth Prol

(57) ABSTRACT

A server information handling system may include a processor; a network interface device (NID); a power source; a vertical backplane for providing electrical and data coupling to a plurality of hard disk drives (HDDs) operatively coupled to the vertical back plane; a plurality of vent holes formed through the vertical backplane; and an acoustic dampening device including a duct extension protruding away from the plurality of vent holes formed through the vertical backplane; the duct extensions to acoustically separate a fan system of the server information handling system from the plurality of HDDs within the information handling system server by mitigation of acoustic energy transmission generated by airflow through the plurality of vent holes.

20 Claims, 10 Drawing Sheets

(56) References Cited

U.S. PATENT DOCUMENTS

2020/0051540 A1 2/2020 Doglio
2020/0068741 A1 2/2020 Waters

* cited by examiner

SYSTEMS AND METHODS OF FORMING A BACKPLANE AIRFLOW GUIDE

FIELD OF THE DISCLOSURE

The present disclosure generally relates to thermal regulation of server systems. The present disclosure more specifically relates to acoustic dampening within server systems.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Information handling systems may be used as servers to conduct processing or provide storage solutions such as private network or cloud-based storage servers. Such storage servers may have several disk drives or static drives in banks of available memory.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
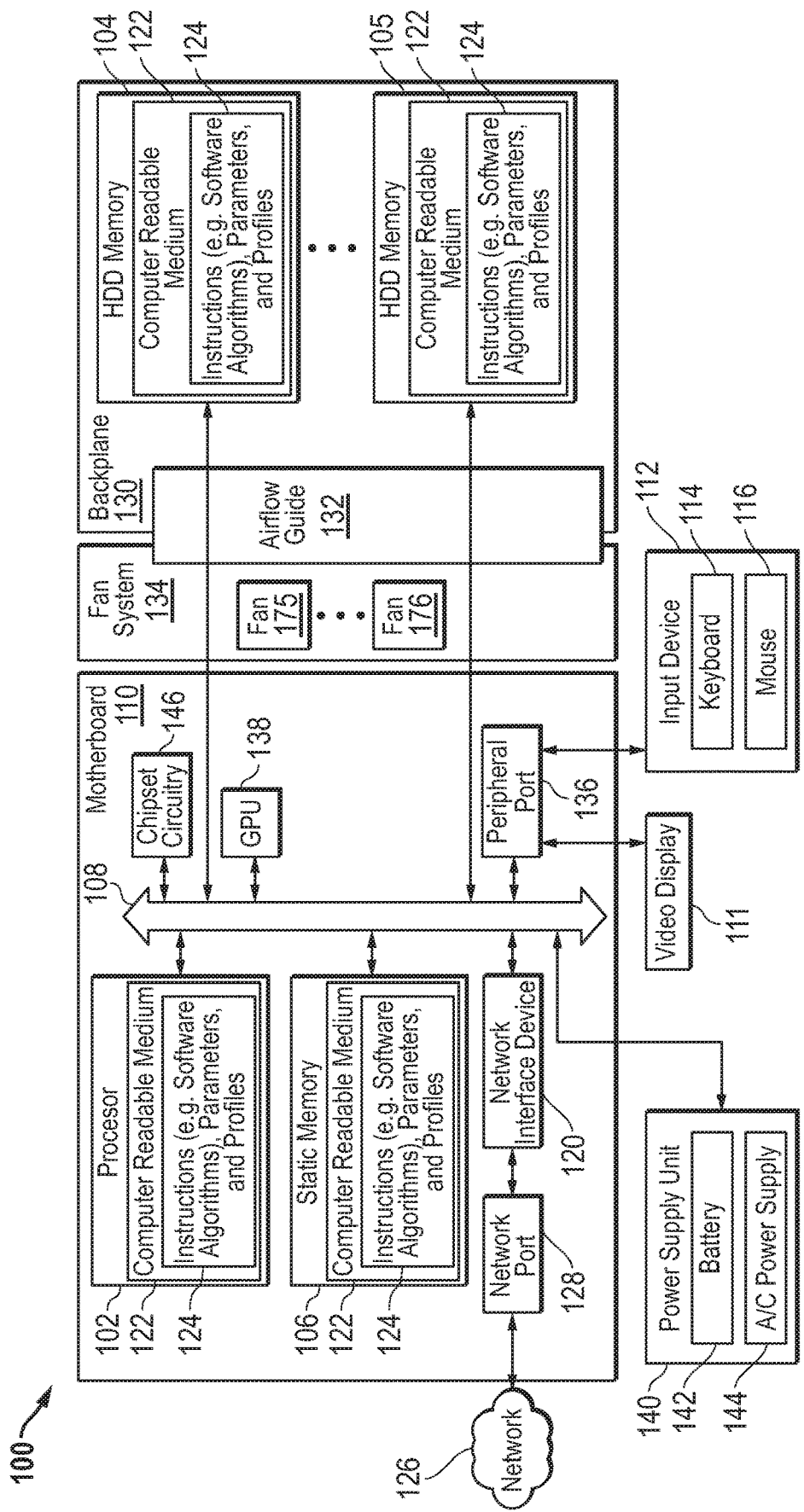
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for acoustic dampening of acoustic energy produced and transmitted within a computing device and, in particular, a server system. Often, these server systems may include hard disk drives (HDDs). In some embodiments, these drives use magnetic storage discs that rotate to be read by a magnetic reading head. Because of the mechanical interaction of the reading head to the rotating storage disc, physical shocks or vibration to the magnetic head may induce data reading and writing errors by shifting the location of the magnetic head along the surface of the magnetic storage discs. This may, in turn, cause errant use of sectors or cause slower read or write operations as the drive compensates. The present specification describes a system and method to prevent or reduce acoustic energy produced within the information handling system from affecting the position of the magnetic head relative to the magnetic storage disc as well as the operation of the HDDs generally. In the present specification and in the appended claims, the term "acoustic energy" is meant to be understood as any energy present or converted from a sound wave whether audible to the human ear or not.

The noises or other acoustic energy produced by the operation of the information handling system (e.g., a server system) may include that caused by the passage of air throughout the information handling system form an active cooling system such as a fan or blower. As the air passes through, for example, holes formed through the backplane, the turbulence created may increase the levels of acoustic energy created. This turbulence, along with the operation of the fans that create the airflow (regardless of their position within the information handling system), creates acoustic energies that can cause the HDDs to malfunction or slow HDD operation. For example, transmission of the acoustic energy from one or more fan systems to the HDD may cause vibration in the magnetic head of the HDD. The present specification describes a backplane of a server that may be disposed in a vertical backplane, a plurality of holes formed through the vertical backplane; and a duct extension protruding away from each of the plurality of holes formed through the vertical backplane. The duct extensions may further include an acoustical dampening device to mitigate acoustic energy as well as noise and vibration caused by a fan system airflow in the server from at an HDD array within the server.

As described, the duct extensions may include an acoustical dampening device that is of one or more of a plurality of forms to reduce acoustic energy transmission to the HDDs. In an embodiment, the acoustical dampening device may be a duct extension that further include an aperture that flares away from the vent holes in the vertical backplane to control the velocity vector of airflow created by the fan system. Additionally, or alternatively, the acoustical dampening device may be a duct extension may include a louvre formed at each duct extension to direct airflow in a direction non-orthogonal to the flow of air through the vent holes in the vertical backplane. Additionally, or alternatively, the duct extension may further include an aperture that flares away from the vertical backplane along with a honeycomb-shaped grating as an additional acoustic dampening device formed at a flared end of the duct extension to direct airflow in a direction orthogonal to the flow of air through the vent holes in the vertical backplane. Additionally, or alternatively, the acoustical dampening device may be a duct extension that may further include a quarter wave resonator. Additionally, or alternatively, the acoustical dampening device is a duct extension that may further include a plurality of expansion chambers to baffle the acoustic intensity of airflow through the holes and duct extension. Additionally, or alternatively, the duct extension may have an additional acoustical dampening device that further include a foam ring formed around an orifice of the acoustical dampening device. Additionally, or alternatively, the acoustical dampening device may be a duct extension that further include a serpentine baffle that allows airflow to pass through the vent holes and duct extension while reflecting acoustic energy away from the vent holes and vertical backplane in yet other embodiments.

In an embodiment, the duct extension may be formed in an airflow guide plate that is secured to the vertical backplane via a coupling device used to couple the duct extensions and airflow guide plate to the vertical backplane in embodiments. In another embodiment, the duct extension may be coupled to the vertical backplane via coupling devices or bonding, such as with adhesives or heat, used to couple the duct extensions to the vertical backplane in various embodiments. In yet another embodiment, the duct extension may be formed into a single, monolithic piece with the vertical backplane. In example embodiments, plural duct extensions or other acoustical dampening device components may be formed on an airflow guide plate, the duct extensions, or onto the vertical backplane.

In the embodiment where the duct extensions are formed into an airflow guide plate to be coupled to the vertical plane, the duct extensions may be placed on the airflow guide plate to align with vent holes formed through the vertical backplane. This may allow the duct extensions to be removed and replaced with another type of duct extension with replacement of the airflow guide plate so as to accommodate for different acoustic energy changes generated within the information handling system such as with upgrades in the type of fan used or in layout design changes of servers that may use similar racks or chassis in some embodiments. Change to the duct extension type or other type of acoustical dampening device such as physical barriers added within or removed from within or rearranged in the information handling system may be easily accomplished without redesign or replacement of more components of the server system.

The server information handling systems described herein may include, as described, a chassis that holds the components of the server such as the HDDs, a motherboard, and a cooling system that includes a plurality of fans. Because of the limited space within the chassis for some embodiments, the duct extensions described herein will generally have a thin cross-section such that little space is used when coupled to the vertical backplane while still mitigating the acoustic energy created by the components of the information handling system server according to some embodiments as described herein. For example, to fit the vertical backplane, HDDs, and motherboard or other board components within a chassis of limited depth, the duct extensions on a duct extension plate may be only 1 cm or less in some example embodiments. In other embodiments, more chassis space may be available and more space is therefore available for acoustical dampening devices and duct extensions.

FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a facsimile machine, a printer, a personal trusted device, a web appliance, or any other suitable machine capable of executing a set of instructions (sequential or otherwise) that specify actions to be taken by that machine, and can vary in size, shape, performance, price, and functionality. In the context of the present specification, the information handling system 100 is described in the context of being a server system, however, it is appreciated that these other types of information handling systems may also benefit from the use of the principles and systems described herein.

In a networked deployment, the information handling system 100 may operate in the capacity of a server or as a client computer in a server-client network environment, or as a peer computer system in a peer-to-peer (or distributed) network environment. In a particular embodiment, the information handling system 100 can be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 can include one or more storage devices, one or more communications ports for communicating with external devices, as well as, various input and output (I/O) devices, such as a keyboard, a mouse, a video/graphic display, or any combination thereof. The information handling system 100 can also include one or more buses operable to transmit communications between the various hardware components. Portions of an information handling system 100 may themselves be considered information handling systems 100.

Information handling system 100 can include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 can include memory such as HDD memory devices 104, 105, static memory 106, computer readable medium 122 storing instructions 124, and drive unit 116 (volatile (e.g. random-access memory, etc.), nonvolatile (read-only memory, flash memory etc.) or any combination thereof). Along with the processor 102, the information handling system 100 may include a graphical processing unit (GPU) 138. In an embodiment, the GPU 138 may provide graphics processing for the video display 111 or, additionally or alternatively, provide graphical processing services to those client computing devices communicatively coupled to the information handling system 100 via the network. The information handling system 100 may further include any chipset circuitry 146 that may include any set of electronic components that manages data flow between the processor 102, any memory devices 104, 105, 106, and any peripheral devices such as the video display 111 and the input devices 112.

The information handling system 100 can also include one or more buses 108 operable to transmit communications between the various hardware components such as any combination of various input and output (I/O) devices. The bus 108 may include, in an embodiment, specific hardware to connect components of the information handling system 100 include an edge connector or 90-degree connector.

As described herein, the information handling system 100 may include one or more HDD memory devices 104, 105. These HDD memory devices 104, 105 may be placed with a bank configuration at, for example, a backplane 130 of the information handling system 100. The HDD memory devices 104, 105 may store data used by another information handling communicatively coupled to the information handling system 100 via the network interface device 120 and its network port 128 across a network 126. The information handling system 100, acting as a central server, may offer certain network services such as software as a service (SaaS) services, data as a service (DaaS) services, application platform as a service (aPaaS) services, among other types of network services associated with the operation of a server.

The information handling system 100 may further include a video display 111. The video display 111 in an embodiment may function as a liquid crystal display (LCD), an organic light emitting diode (OLED), a flat panel display, or a solid-state display. Additionally, the information handling system 100 may include an input device 112, such as a cursor control device (e.g., mouse 116, touchpad, or gesture or touch screen input), and a keyboard 114. The keyboard 114 and mouse 116, as well as any other input device 112, may be coupled to a motherboard 110 via a peripheral port 136 used to communicatively couple these devices to the bus 108 and other components of the information handling system 100. The information handling system 100 can also include a disk drive unit in some embodiments used to receive a disc comprising data.

The network interface device 120 can provide connectivity to a network 126, e.g., a wide area network (WAN), a local area network (LAN), wireless local area network (WLAN), a wireless personal area network (WPAN), a wireless wide area network (WWAN), or other networks. Connectivity may be via wired or wireless connection. The network interface device 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links. As described, the information handling system 100 may include a port 128 used to physically connect the information handling system 100 and network interface device 120 to the network 126 via, for example, an Ethernet cable. Any number of ports 128 may be used to allow for communication, via the network 126, to the information handling system 100 form a plurality of client devices.

Network interface device 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices can be constructed to implement one or more of some systems and methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 126 can communicate voice, video or data over the network 126. Further, the instructions 124 may be transmitted or received over the network 126 via the network interface device 120 or other wireless adapters.

The information handling system 100 can include a set of instructions 124 that can be executed to cause the computer system to perform any one or more of the methods or computer-based functions disclosed herein. For example, instructions 124 may execute, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The static memory 106 and HDD memory devices 104, 105 may include a computer-readable medium 122 in which one or more sets of instructions 124 such as software can be embedded. Similarly, a main memory and static memory 106 may also contain a computer-readable medium for storage of one or more sets of instructions, parameters, or profiles 124. The disk drive unit and static memory 106 may also contain space for data storage. Further, the instructions 124 may embody one or more of the methods or logic as described herein. For example, instructions relating to the operation of the fan system 134, software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100. As explained, some or all of the instructions, parameters, and profiles 124 may be executed locally or remotely. The HDD memory devices 104, 105 and the processor 102 also may include computer-readable media.

It is appreciated that the information handling system 100 may contain any type of computer-readable medium such as RAM in an example embodiment. An example of this memory, includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium 122, such as NOR or NAND flash memory in some example embodiments. Any computer-executable program code may be stored in static memory 106, or the drive unit on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

As described, the information handling system 100 may also include a motherboard 110 in the form of a printed circuit board (PCB). The motherboard may operably connect the processor, 102, the static memory 106, the network interface device 120, the network port 128, the peripheral port 136, the GPU 138, and chip circuitry to each other via the bus 108. The bus 108 may be any type of communication coupling device used to connect any of these components to each other regardless of whether the motherboard 110 is separated into any number of PCBs such as a midplane, backplane, daughterboard, and the like.

The information handling system may also include a fan system 134. The fan system 134 may include any type of fan that causes airflow to be created throughout the information handling system 100. In a particular embodiment, the fan system 134 may include a plurality or bank of fans that each pull or push air into the information handling system 100 and out of the information handling system 100. In a specific embodiment, each of the fans of the fan system 134 may be an axial fan that have blades that force air to move parallel to the shaft about which the blades rotate such that air is pulled from the backplane 130 where the bank of HDD memory devices 104, 105 are coupled within the information handling system 100 to the motherboard and out of the information handling system 100.

As described herein, the information handling system 100 may also include a power supply unit 140. The power supply unit 140 may be communicatively coupled to the bus 108 or, alternatively, each component on the motherboard 110 individually. The power supply unit 140 may be specifically operatively coupled to the processor 102, fan system 134, HDD memory devices 104, 105 to facilitate the operation of those devices as described herein. The power supply unit 140 may, in an embodiment include a battery 142 and an A/C power supply 144. The power supply unit 140 may provide A/C power to the components of the information handling system 100 as described herein and, when the A/C power supply 144 is not available, provide power via the battery 142. The power supply unit 140 may be coupled to fan system 134 within the information handling system 100 in order to provide driving power to the individual fans during operation as described.

The information handling system 100 may also include an airflow guide 132. The airflow guide 132 may be any device described herein that directs or changes the airflow of the air passing throughout the information handling system 100, such as passing though backplane vent holes according to embodiments herein for example. In the embodiments described herein, the airflow guide 132 may include and be formed as part of a vertical backplane that is placed between the fan system 134 and the backplane 130. The vertical backplane may include any number vent holes formed therethrough and a plurality of 90-degree connectors or edge connectors used to operatively couple the motherboard 110 to the HDD memory devices 104, 105. Alternatively, the vertical back plane may be separate from the airflow guide 132 with the airflow guide 132 being selectively coupled to the vertical backplane using a fastener or other coupling device. Therefore, in some embodiments, the vertical backplane and airflow guide 132 form a monolithic piece while in other embodiments, the vertical backplane and airflow guide 132 are separate pieces that mechanically couple to each other. In yet other embodiments, the airflow guide 132 may be formed on an airflow guide plate that may be operatively coupled to the vertical backplane using a fastener or other coupling device and align airflow guides with backplane vent holes.

In an embodiment, the airflow guide 132 may be made of any material that helps to direct airflow as well as contain acoustic energy to a location away from the HDD memory devices 104, 105. In an embodiment, all or a portion of the airflow guide 132 may be made of a sound absorbing material such as a plastic, a carbon fiber material, foam material, or a mass-loaded material (e.g., mass loaded with foam, gypsum, vinyl or other acoustic energy absorbing material). In an embodiment, all or a portion of the airflow guide 132 may be made of a sound deflection material such as a metal used to deflect any acoustic energy away from the HDD memory devices 104, 105. In an embodiment, the airflow guide 132 and/or the duct extensions may be formed via an additive 3D printing process, a subtractive 3D printing process, or a molding process. For example, an injection molding process may be used in some embodiments.

The vertical backplane of the airflow guide 132 may further include one or more vent holes formed therethrough to allow air to pass to or from the backplane 130 and HDD memory devices 104, 105 and the remaining areas within the information handling system 100. In an embodiment, the vent hole formed in the airflow guide 132 may match a position or size of any vent holes formed through the vertical backplane when the airflow guide 132 and vertical backplane are two separate components. In other embodiments, the vent holes formed for the airflow guides 132 in an airflow guide plate may match a position of any vent holes formed through the vertical backplane when the airflow guides 132 on the airflow guide plate and vertical backplane are two separate components. The airflow guide 132 may further include duct extensions that protrude away from each of the vent holes formed therethrough. As described herein, the duct extensions may extend from the vent holes in any angle depending on type as disclosed. Generally, a normal or orthogonal direction away from the surface of the vertical backplane where the vent holes are formed may be used in some embodiments.

These duct extensions may be designed to incorporate one or several features used to target a physics mechanism required to reduce acoustic energy within the area of the information handling system 100. These mechanisms of the duct extensions may each reduce any acoustic energy produced by the airflow created by the activation of the fan system 134 through the vent holes or acoustic energy produced by the operation of other components of the information handling system. Additionally, the mechanisms of the duct extensions may each also reduce the transmission of higher frequency acoustic energy from fan blades associated with the fans of the fan system 134.

The duct extensions may be designed to incorporate any design to achieve a specific outcome. In a specific embodiment, the duct extensions include an aperture that flares away from the vertical backplane to control the velocity vector of airflow created by the fan system. In another embodiment, a grating or louvre design may be employed to redirect airflow at a non-normal direction from the vertical backplane. In this embodiment, the grating or louvre may be placed near the fan face in order to help reduce any acoustic energy created by any non-uniform airflow impacting the fan blades of the fans within the fan system 134 or vortexes created by the airflow exiting the vent holes.

In yet another embodiment of the duct extensions, a passive acoustical element or elements may be employed to baffle any sounds throughout the information handling system 100. These elements may include a Helmholtz resonator, baffle stack, expansion chambers, quarter-wavelength rejection elements, among others. These elements may reject or, at least, dampen any acoustic energy created by the fans from propagating to the HDD memory devices 104, 105. Additionally, or alternatively, a number of acoustic dampening devices such as absorptive foam or honeycombed wall may be employed to reduce the transmission of acoustical energy from the fans of the fan system 134 to the HDD memory devices 104, 105.

As the airflow passes the HDD memory devices 104, 105 it is jetted through the vent holes of the vertical backplane 130. The duct extensions and other acoustical dampening devices prevent turbulence from being created at the vent holes formed through the vertical backplane. The duct extensions and other acoustical dampening devices reduce or prevent that acoustic energy associated with turbulence from the vertical backplane vent holes and any cabling associated therewith, as well as further preventing uneven airflow or non-normal velocity of airflow against any face of any fan blades on the fans within the fan system 134. In an embodiment, the duct extension may have walls forming an aperture through the duct extension that is sized and align with the aperture of a vent hole or vent holes in a backplane 130 to reduce generation of acoustic energy by airflow through those backplane vent holes. In some aspects, the duct extensions may flare or open to a wider aperture or to an expander cavity or baffling system from the aperture size of the backplane vent holes.

In other embodiments, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations. In a specific embodiment, the dedicated hardware may include a fan control module (not shown) that controls the operation of the fan system 134 within the information handling system 100. This fan control module may detect or otherwise be presented with data descriptive of hardware changes made within the information handling system 100 that may affect the airflow characteristics through the duct extensions of the airflow guide 132. In an embodiment, upon detection of these hardware changes within the information handling system 100, the fan control module may either increase or decrease the revolutions of the fan accordingly in order to sufficiently cool the components within the information handling system 100 while also not creating additional acoustic energy within the information handling system 100.

When referred to as a "system", a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. In an embodiment an information handling system 100 may include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
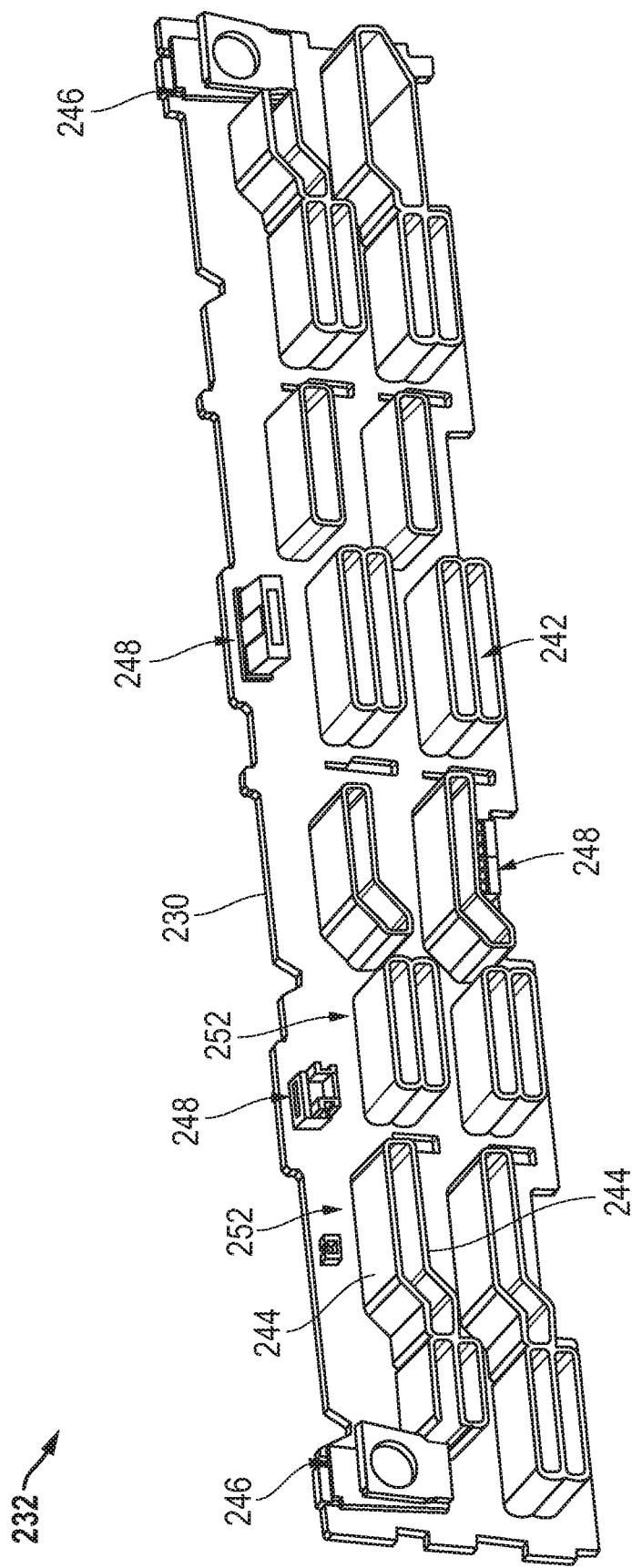
FIG. 2 is a perspective graphical diagram of an airflow guide including a plurality of duct extensions formed on vertical backplane according to an embodiment of the present disclosure.

FIG. 2 is a perspective graphical diagram of an airflow guide 232 including a plurality of duct extensions formed on a vertical backplane 230 according to an embodiment of the present disclosure. In the embodiment shown in FIG. 2, the airflow guide 232 is formed into a monolithic piece with the vertical backplane 230 where duct extensions 252 are formed in the same material as vertical backplane 230. In another embodiment, the duct extensions 252 are permanently attached to the vertical backplane 230 and may include any other devices coupled to the duct extensions 252 as described herein.

In an alternative embodiment, the airflow guide 232 may include duct extensions operatively coupled to a vertical backplane by use of chemical, heat, or a mechanical fastener to bond or mechanically attach the duct extensions to the vertical backplane 230 within the information handling system. In embodiments herein, the one or more airflow guides, such as the duct extensions 252, may be operatively coupled to the vertical backplane and sized and shaped to align with vent holes (not shown) formed in the vertical backplane within the information handling system.

In the embodiment of FIG. 2, the vertical backplane 230 may include a number of vent holes formed therethrough. These vent holes allow for air to pass through the vertical backplane as the fans push or pull air throughout the information handling system as described herein. This creates an airflow through the backplane vent holes that may create acoustic energy by creating vortexes or other acoustic energy-generating air currents. The airflow guide 232 may include any of the duct extensions 252 described in embodiments herein with aperture holes 242 that align with backplane vent holes to reduce or eliminate that acoustic energy. For example, the duct extensions 252 have walls 244 that may extend horizontally from the face of the vertical backplane. These duct extensions 252 may, in an embodiment, form part of the vertical backplane 230 as a monolithic piece. In another embodiment, the duct extensions 252 may be coupled to the vertical backplane 230 via any coupling device or via any method that may be used to secure the duct extensions 252 to the vertical backplane 230. In this embodiment, a coupling device may include a screw, clip, or other fastener, a form fit, a glue or adhesive, or any other mechanical, chemical, or other bonding device that permanently or temporarily secures the individual duct extensions 252 to the vertical backplane 230. In this embodiment, certain methods such as sonic welding or melting may be used to secure the duct extensions 252 to the vertical backplane 230 at the vent holes formed through the vertical backplane 230.

In an embodiment, the duct extension 252 may have walls 244 forming an aperture 242 through the duct extension that is sized and align with the aperture of a vent hole or vent holes formed through a the vertical backplane 230 to reduce generation of acoustic energy by airflow through those backplane vent holes. In one embodiment, the walls may horizontally extend away from the face of the vertical backplane 230 as shown. The extension in some embodiments may be less than 1 cm, but any length is contemplated in embodiments herein. In other aspects as described in embodiments below, the duct extensions 252 may flare or open to a wider aperture or to an expander cavity or baffling system from the aperture size of the backplane vent holes.

The airflow guide 232, in the embodiment shown in FIG. 2, may include a number of duct extensions 252 that extend from a planar surface of the vertical backplane 230 to form the airflow guide 232. The duct extensions 252 may be sized and shaped to correspond to the vent holes in the vertical backplane 230. In an example embodiment, the duct extensions 252 may have an aperture 242 sized to aligned with the vent holes and their aperture size at the vertical backplane. In this particular embodiment, the duct extensions 252 may include a number of walls 244 that extend normally from the planar surface of the vertical backplane 230. As shown, the number of walls 244 are formed around an entire perimeter each of the aperture holes 242 that align with backplane vent holes. In such an embodiment, the aperture holes 242 may generally remain the same size as the duct extensions 252 protrude away from the planar surface of the backplane 230. The duct extensions 252 of the airflow guide 232 may create specific airflow path from the backplane 230 to the fan system in the information handling system. In this embodiment, the duct extensions 252 prevent acoustic energy from the turbulence created by the airflow from reaching the HDD memory devices. In other embodiments of the present disclosure, such as according to those in FIGS. 4-9, the aperture holes 242 of duct extensions 252 may change in aperture size or have other structures for acoustic dampening formed or attached. In some embodiments, the duct extension aperture holes 242 may initially be sized and shaped to align with the size and shape of the vent holes in the vertical backplane, but may be modified in aperture size by the form of the duct extension 252 used. Such embodiments may also further prevent acoustic energy from the turbulence created by the airflow from reaching the HDD memory devices as described herein.

As described in a specific embodiment herein with respect to FIG. 3 below, the duct extensions 252 of the airflow guide 232 may be a separate part from the vertical backplane. In an embodiment, the airflow guide 232 may include a planar support plate with duct extensions 252 having a number of duct extension walls 244 and aperture holes 242 as part of an airflow guide plate shown in FIG. 3 to align with vent holes of a vertical backplane. In this embodiment, the airflow guide plate is capable of being coupled to a vertical backplane 230 used for mounting the HDD memory devices to form an airflow guide.

The vertical backplane 230 may further include a number of electrical or communication connectors 248 that allow the HDD memory devices to be operatively coupled to, for example, the processor or other electrical components of the information handling system. These electrical or communication connector structures 248 may accommodate any type of wire or connector such as a 90-degree connector or an edge connector. The vertical backplane 230 may further include a number of fasteners or coupling devices such as clips 246 to secure the vertical backplane 230 with airflow guide 232 to, in some embodiments, any portion of a chassis of the information handling system. In the specific embodiment shown in FIG. 2, the clips 246 are used to operatively coupled the vertical backplane 230 with the airflow guide 232 to a chassis of the information handling system. Other fasteners may be used such as screws, pins, form fit or snap fit connectors, or other fastener systems.

In the embodiment where the vertical backplane 230 and airflow guide 232 has duct extensions 252 that are separate pieces, the duct extensions 252 may also be selectively removable from the vertical backplane 230. In this embodiment, the fasteners, clips, or form fitted coupling between the duct extensions 252 and the vertical backplane 230 may allow the airflow guide 232 to be modified. One or more duct extensions 252 may be removable or replaceable with other sizes or forms of duct extensions 252 according to various embodiments herein in order to accommodate for physical changes within the information handling system design to accommodate different disk drives or other drive and system component layouts, or differing fan arrangements or power levels that may affect the airflow within the information handling system. As described herein and especially in connection with FIGS. 4-9, the form of the duct extensions 252 and any additional acoustical dampening devices coupled to the duct extensions 252 may be changed based on the layout of the components of the information handling system. In the embodiment shown in FIG. 2, the airflow guide 232 may be a stationary vertical backplane 230 with the duct extensions 252 and any acoustical dampening device coupled thereto being selectively removable in some embodiments. In others, the duct extensions 252 may be chemically or otherwise bonded or formed monolithically with the vertical backplane 230.

Figure 3:
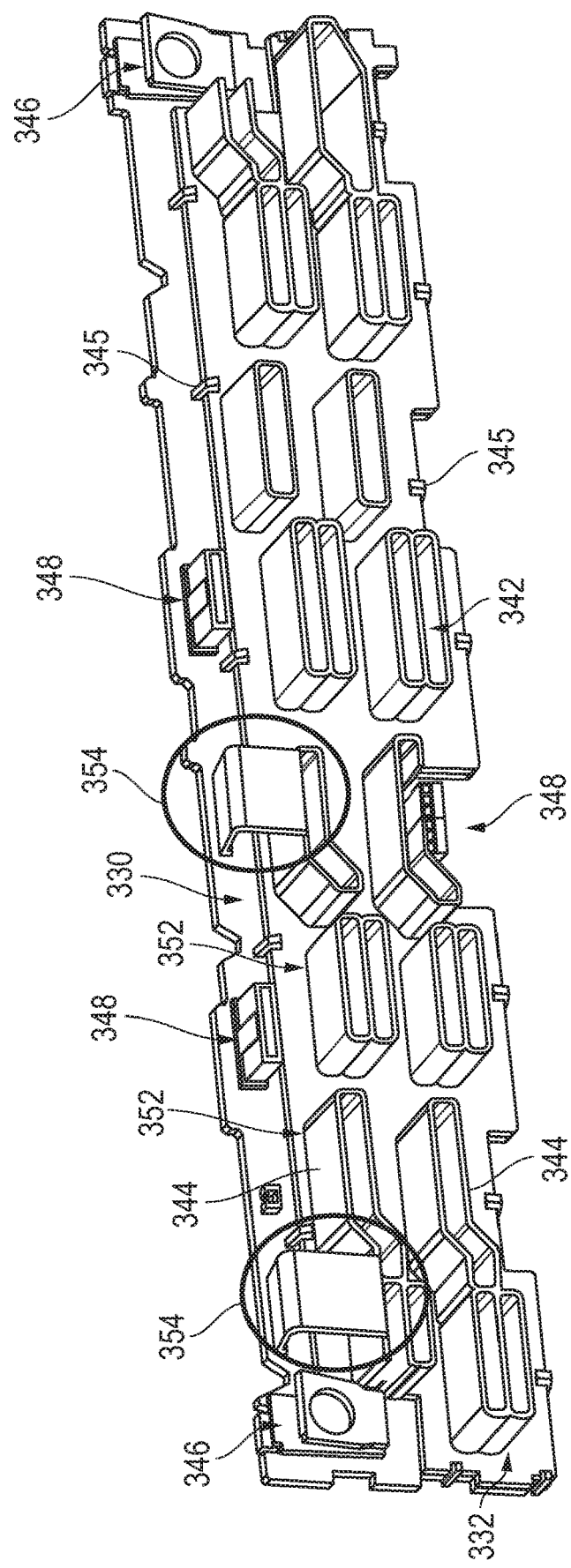
FIG. 3 is a perspective graphical diagram of an airflow guide plate with duct extensions formed thereon forming an airflow guide and coupled to a vertical backplane according to another embodiment of the present disclosure.

FIG. 3 is a perspective graphical diagram of an airflow guide plate 332 with duct extensions 352 formed thereon forming an airflow guide coupled to a vertical backplane 330 according to another embodiment of the present disclosure. In the embodiment shown in FIG. 3, the airflow guide is formed out of a backplane 330 with an airflow guide plate 332 operatively coupled to it. In this embodiment, the duct extensions 352 are formed on the airflow guide plate 332 and may be of any form according to embodiments of the present disclosure with the airflow guide plate 332 being selectively attached to the vertical backplane 330 and may include any other devices coupled to the duct extensions 352 as described herein.

In the embodiment of FIG. 3, the vertical backplane may include a number of vent holes (not shown) formed therethrough. These vent holes allow for air to pass through the vertical backplane 330 as the fans push or pull air throughout the information handling system as described herein. This creates an airflow through the vent holes of the vertical backplane 330 that may create acoustic energy by creating vortexes or other acoustic energy-generating air currents. The airflow guide plate 332 may include duct extensions 352 described herein with aperture holes 342 that align with backplane vent holes to reduce or eliminate that acoustic energy. In this embodiment shown in FIG. 3, the airflow guide plate 332 and duct extensions 352 may be formed into a monolithic piece. In an alternative embodiment, the duct extensions 352 may be secured to the airflow guide plate 332 via mechanical or chemical coupling or bonding as described to align by the airflow guide plate with the vent holes formed into the vertical backplane 330.

In an embodiment, the duct extension 352 may have walls 344 forming an aperture 342 through the duct extension that is sized and align with the aperture of a vent hole or vent holes in a backplane 330 to reduce generation of acoustic energy by airflow through those vent holes formed through the backplane 330. In one embodiment, the walls 344 may horizontally extend away from the face of the vertical backplane 330 as shown. The extension in some embodiments may be less than 1 cm, but any length is contemplated in embodiments herein. In other aspects as described in embodiments below, the duct extensions 352 may flare or open to a wider aperture or to an expander cavity or baffling system from the aperture size of the vent holes as described herein. In this particular embodiment shown in FIG. 3, the duct extensions 352 may include a number of walls 344 that extend normally from the planar surface of the airflow guide plate 332. As shown, the number of walls 344 are formed around an entire perimeter of a number of vent holes formed through the airflow guide plate 332 with each of the aperture holes 342 being aligned with the vent holes formed through the backplane 330 as well. The duct extensions 352 may be sized and shaped to correspond to the vent holes in the vertical backplane 330. In an example embodiment, the duct extensions 352 may have an aperture 342 sized to aligned with the vent holes and their aperture size at the vertical backplane. The duct extensions 352 of the airflow guide plate 332 may create specific airflow path from the backplane 330 to the fan system in the information handling system. In this embodiment, the duct extensions 352 prevent acoustic energy from the turbulence created by the airflow from reaching the HDD memory devices placed within the information handling system. In such an embodiment, the aperture holes 342 may generally remain the same size as the duct extensions 352 protrude away from the planar surface of the backplane 330. In other embodiments of the present disclosure, such as according to those in FIGS. 4-9, the aperture holes 342 of duct extensions 352 may change in aperture size or have other structures for acoustic dampening formed or attached. In some embodiments, the duct extension aperture holes 342 may initially be sized and shaped to align with the size and shape of the vent holes in the vertical backplane 330, but may be modified in aperture size by the form of the duct extension 352 used. Such embodiments may also further prevent acoustic energy from the turbulence created by the airflow from reaching the HDD memory devices as described herein.

As described, in an embodiment, the duct extensions 352 of the airflow guide plate 332 may be a separate part from the vertical backplane 330. In an embodiment, the airflow guide plate 332 may serve as a planar support plate for the duct extensions 352 having a number of duct extension walls 344 and aperture holes 342 to align with vent holes of a vertical backplane 330. The airflow guide plate 332 is capable of being coupled to the vertical backplane 330 used for mounting the HDD memory devices. In some embodiments, the airflow guide 332 may be capable of being operably coupled to other components of the information handling system such as a chassis of the information handling system.

The airflow guide plate 332 may further include a number of electrical or communication connector pass through structures 348 that allow the HDD memory devices to be operatively coupled to, for example, the processor or other electrical components of the information handling system. These electrical or communication connectors 348 may accommodate any type of wire or connector such as a 90-degree connector or an edge connector. In this embodiment, the airflow guide plate 332 may include a number of electrical or communication connector pass through structures or gaps to allow the electrical or communication connectors 348 of the vertical backplane 330 to be accessible. Thus, the electrical or communication connectors 348 may be formed to interface with each other in order to low the HDD memory devices to be operatively coupled to, for example, the processor or other electrical components of the information handling system.

The airflow guide plate 332 and/or vertical backplane 330 may further include a number of fasteners or coupling devices such as snap fit fastener 345 to secure, for example, the airflow guide plate 332 to a vertical backplane 330. Any fastener is contemplated including use of a screw between the airflow guide plate 332 and the vertical backplane 330 or clip similar to that shown at 346 to hold airflow guide plate 332 to a vertical backplane 330. Other fasteners or coupling devices such as clips 346 may be used to secure any of the airflow guide plate 332 or vertical backplane 330 to any portion of a chassis of the information handling system. In the specific embodiment shown in FIG. 3, the clips 346 may be used to operatively coupled the airflow guide plate 332 to both the backplane 330 and a portion of a chassis of the information handling system. Other fasteners may be used such as screws, pins, form fit or snap fit connectors, or other fastener systems to independently couple the airflow guide plate 332 to the backplane 330, the airflow guide plate 332 to the chassis of the information handling system, and/or the backplane 330 to the chassis of the information handling system.

In the embodiment shown in FIG. 3 where the vertical backplane 330 and airflow guide plate 332 are separate pieces, the airflow guide plate 332 with the duct extensions 352 may also be selectively removable from the vertical backplane 330. In this embodiment, the snap fit fastener elements 345 may allow the airflow guide plate 332 to be removable and replaceable with a different airflow guide plate 332 with different duct extensions in order to accommodate for physical changes within the information handling system design to accommodate different disk drive or other drive and system component layouts that may affect the airflow within the information handling system. As described herein and especially in connection with FIGS. 4-9, the form of the duct extensions 352 and any additional acoustical dampening devices coupled to the duct extensions 352 may be changed based on the layout of the components of the information handling system. In the embodiment shown in FIG. 3, the airflow guide plate 332 may be a stationary planar support plate with the duct extensions 352 and any acoustical dampening device coupled thereto being selectively removable via the clips.

In an embodiment, the airflow guide plate 332 may include a plurality of wire guides 354. The wire guides 354 may be used by the airflow guide plate 332 and backplane 330 to secure any wires against the backplane 330 that are used to connect to the electrical or communication connector structures 348 described herein. The wire guides 354 may be formed onto the airflow guide plate 332 as shown in FIG. 3 or may be formed as part of the backplane 330 in other embodiments. In a specific embodiment, the wire guides 354 may be used to not only secure the wires between the airflow guide plate 332 and backplane 330 but also prevent the wires from interfacing or interfering with the aperture holes 342 of the duct extension 352 or any fan systems nearby. The wires secured by the wire guides 354 prevent any airflow out of the aperture holes 342 from being disrupted by the wires and creating unintended vortexes that may create more acoustic energy.

Figure 4:
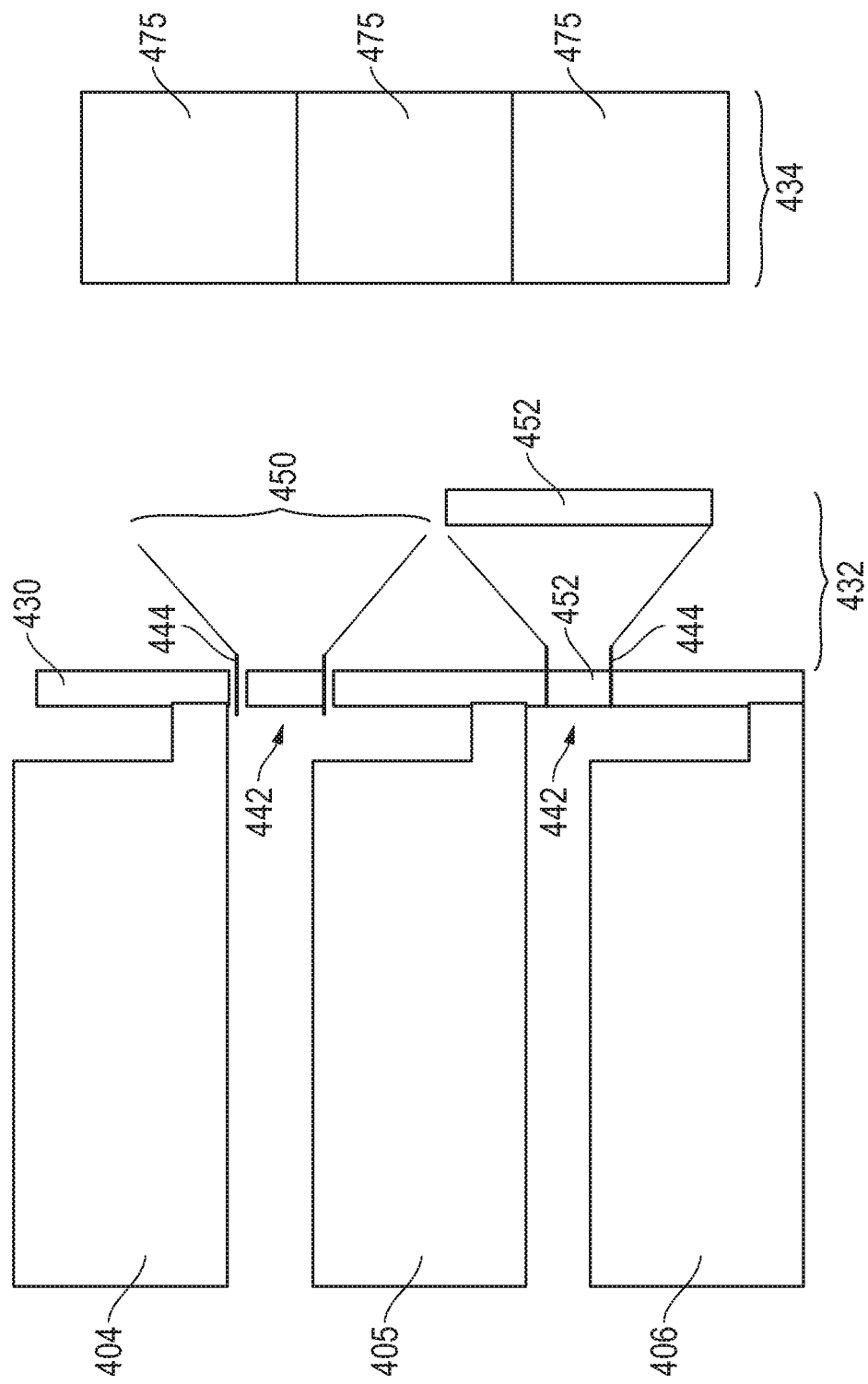
FIG. 4 is a block diagram of an airflow guide having a vertical backplane and duct extension in a portion of an information handling system with a cooling system according to an embodiment of the present disclosure.

FIG. 4 is a cross-section block diagram of an airflow guide 432 with a vertical backplane 430 and duct extension 450 according to an embodiment of the present disclosure. FIG. 4 shows a vertical backplane 430 with a number of walls 444 and duct extensions 450 coupled thereto. In an embodiment described herein, the number of walls 444 and duct extensions 450 may be selectively removeable from the vertical backplane 430. In an alternative embodiment, the number of walls 444 and duct extensions 450 and vertical backplane 430 may be formed into a monolithic piece. In yet an alternative embodiment, the number of walls 444 and duct extensions 450 may form part of an airflow guide plate (not shown) such as that described in connection with FIG. 3. In this embodiment, the airflow guide plate may be coupled to the vertical backplane 430 via a fastening device such as a clip or snap fit elements. Thus, although FIG. 4 shows a specific example where the number of walls 444 and duct extensions 450 and vertical backplane 430 are coupled together, the present specification contemplates those alternative embodiments shown and described in connection with FIGS. 2 and 3.

In this embodiment, as well as in the embodiments shown in FIGS. 4-8, the HDD memory devices 404, 405, 406 may be placed behind the vertical backplane 430 with operative coupling for both power and data communication via the vertical backplane 430. The shown vertical backplane 430 may also include, in some embodiments, a planar support plate structure of an airflow guide plate attached to vertical backplane 430 to support one or more duct extensions 450 or other acoustic dampening structures. Either a separate airflow guide plate or a vertical backplane 430 with one or more duct extensions 450 or other acoustic dampening structures attached are contemplated in embodiments herein. The vertical backplane 430 separates the HDDs 404, 405, 406 from a number of fans 475 of a fan bank 434 as described herein. Additionally, a fan bank 434 including one or more fans 475 may be placed on an opposite side of the vertical backplane 430 and HDDs 404, 405, 406 in other embodiments to push or draw air through the information handling system. Specifically, the fans 475 of the fan bank 434 may, in an embodiment, draw air through a number of vent holes 442 formed in the vertical backplane 430.

The airflow guide 432 may include a number of walls 444 that extend out and away from the vertical backplane 430. The walls 444 may form the duct extension 450, shown in cross section, that operates as an acoustic dampening device. In an embodiment, the duct extension 450 has walls 444 forming an aperture through the duct extension 450 that is sized and align with the aperture of a vent hole 442 or vent holes 442 in a backplane 430 to reduce generation of acoustic energy by airflow through those backplane vent holes 442. In some aspects, the duct extensions 450 may flare or open to a wider aperture or to an expander cavity or baffling system from the aperture size of the backplane vent holes 442.

The duct extension 450 may further include an additional acoustic dampening device 452 attached to the duct extension 450. In this embodiment, the duct extension 450 is in the form of a cone extending away from the vent holes in the vertical backplane 430. This duct extension 450 acoustically dampens or reduces acoustic energy of the airflow from the HDD memory devices 404, 405, 406 passing through the vent holes 442, past the walls 444, and to expand out towards to fan bank 434 in the shown embodiment. Other embodiments may have fans push air through the HDD memory devices 404, 405, 406 and vent holes 442 of the vertical backplane 430 and out duct extension 450. The aperture of the duct extension 450 flares away from the vertical backplane 430 in one embodiment. The flare of duct extension 450 may flare in a general cone shape manner in one example embodiment. The flared duct extension 450 may be of any shape and correspond to vent holes 442 to prevents air turbulence from being created while still preventing acoustic energy from being transmitted to other components within the information handling system or to be transmitted away from reaching the HDD memory devices 404, 405, 406. It is also contemplated that the flare of the flared duct extension may be at any loft and could include a linearly flared expansion, a exponentially flared expansion, or a logarithmically flared expansion of the duct extension from the aperture of the vent holes at a junction point with the backplane 430 or an attached airflow guide plate. Additionally, the velocity vector of airflow created by the fan system may be controlled through the use of the vent holes 442, walls 444 of duct extension 450, and an additional acoustic device 452 coupled to a duct extension 450 in various embodiments.

In an embodiment, the duct extension 450 and vent holes 442 may include additional acoustic device 452 that may be a honeycombed grating or other grating, may be a layer of foam, or may be some other sound proofing material. The foam additional acoustic device 452 may be attached in a variety of locations including at the outer end of the flared the duct extension 450 in some embodiments. In other embodiments, the grating or foam additional acoustic device 452 may be formed at the vent holes 442 or anywhere along the duct extension 450 including around perimeters of the aperture anywhere in or at an edge of the duct extensions 450. The grating or foam additional acoustic device 452 may allow airflow to pass through the vent holes 442 but prevent acoustic energy from passing back through the vent holes 442 and to the HDD memory devices 404, 405, 406. Although FIG. 4 shows a specific type of additional acoustic device 452 used with duct extension 450, the present specification contemplates that any type of additional acoustic device 452 described herein may be used along with those shown in FIG. 4.

Figure 5:
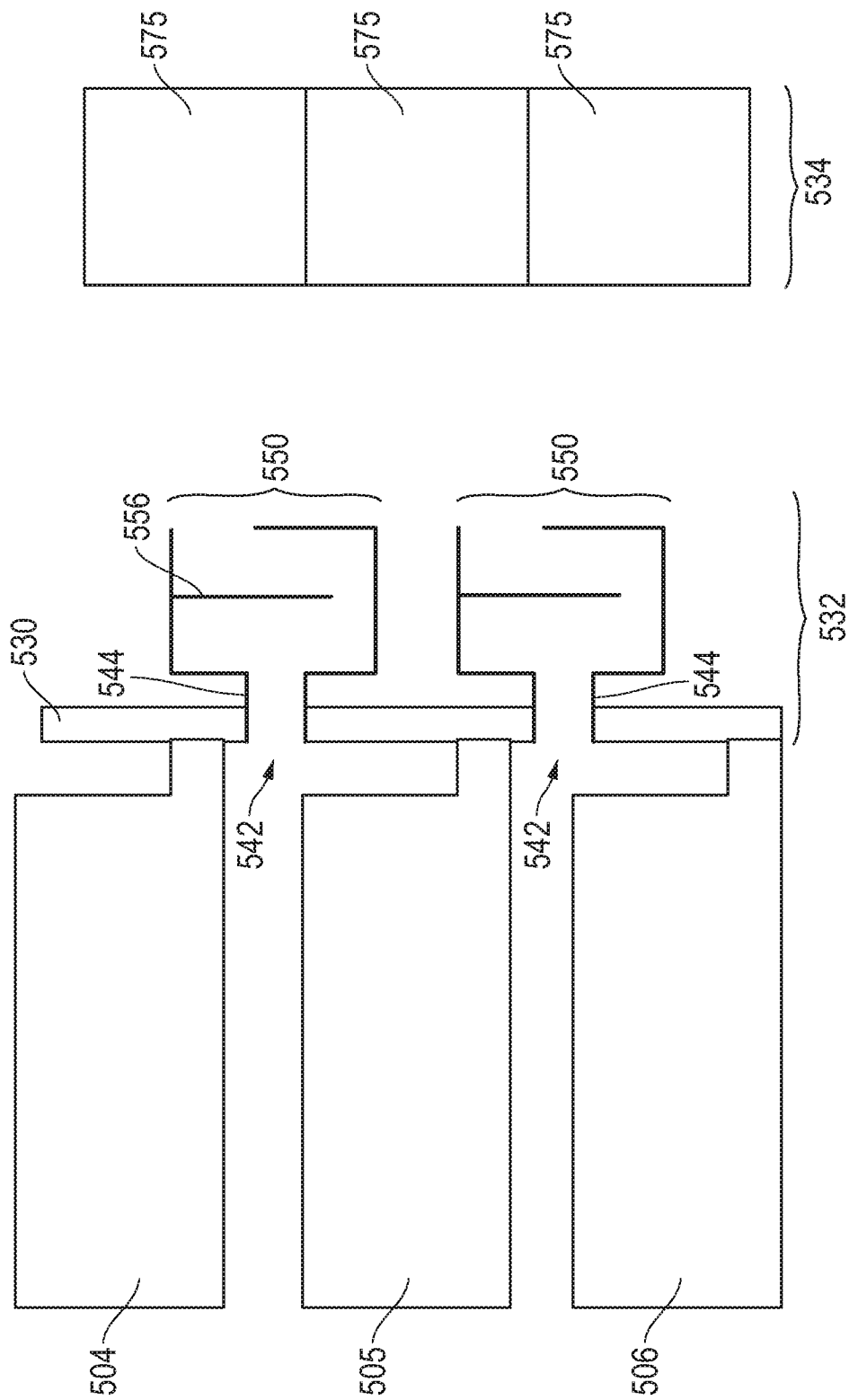
FIG. 5 is a block diagram of an airflow guide having a vertical backplane and duct extension in a portion of an information handling system with a cooling system according to another embodiment of the present disclosure.

FIG. 5 is a cross-section block diagram of an airflow guide 532 having a vertical backplane 530 and duct extension 550 according to another embodiment of the present disclosure. FIG. 5 shows a vertical backplane 530 with a number of walls 544 and duct extensions 550 coupled thereto. In an embodiment described herein, the number of walls 544 and duct extensions 550 may be selectively removeable from the vertical backplane 530. In an alternative embodiment, the number of walls 544 and duct extensions 550 and vertical backplane 530 may be formed into a monolithic piece. In yet an alternative embodiment, the number of walls 544 and duct extensions 550 may form part of an airflow guide plate (not shown) such as that described in connection with FIG. 3. In this embodiment, the airflow guide plate may be coupled to the vertical backplane 530 via a fastening device such as a clip or snap fit elements. Thus, although FIG. 5 shows a specific example where the number of walls 544 and duct extensions 550 and vertical backplane 530 are coupled together, the present specification contemplates those alternative embodiments shown and described in connection with FIGS. 2 and 3.

As with other aspects of the disclosure, the shown vertical backplane 530 may also include, in some embodiments, a planar support plate structure of an airflow guide plate attached to vertical backplane 530 to support one or more duct extensions 550 for an airflow guide 532 or support other acoustic dampening structures. Either a separate airflow guide plate or a vertical backplane 530 with one or more duct extensions 550 or other acoustic dampening structures attached are contemplated in embodiments herein. The airflow guide 532 may include a number of walls 544 that extend out away from the vertical backplane 530 or from an attached airflow guide plate. The walls 544 may form a duct extension 550 according to another embodiment of the present disclosure. In this embodiment, the duct extension 550 is in the form of a baffle. In an embodiment, the duct extension has walls 544 and one or more baffle walls 556 forming an aperture through the baffle duct extension 550 that is sized at a junction end with the backplane 530 or airflow guide plate to align with the aperture of a vent hole 540 or vent holes 542 in a backplane 530 to reduce generation of acoustic energy by airflow through those backplane vent holes. In some aspects, the duct extensions 550 may open to an expander cavity or baffling system from the aperture size of the backplane vent holes 542 as shown in the example embodiment.

The baffle duct extension 550 may include a vertical baffle wall 556 formed therein. This duct extension 550 allows the airflow from the HDD memory devices 504, 505, 506 to pass through the vent holes 542, past the walls 544 and 556, and into the air path formed within the baffle duct extension 550. The baffle duct extension 550 includes an exit point where the air may pass out of the baffle duct extension 550. Because the baffle duct extension 550 includes the vertical baffle wall 556, acoustical energy created from the fan 575 and any turbulence created from the airflow exiting the vent holes 542 into baffle duct extension 550 may be reduced or prevented from passing acoustic energy towards the HDD memory devices 504, 505, 506. The baffle duct extension 550, in some embodiments, may include expansion chambers with a wider cross-section dimension of the baffle duct extension 550 where the air may expand into the baffle duct extension 550 as well as have acoustic dampening via baffle wall 556.

In an embodiment, the acoustic device 550 and vent holes 542 may include a layer of foam or other sound proofing material similar to that shown in FIG. 3. The foam may allow airflow to pass through the vent holes 542 but prevent acoustic energy from passing back through the vent holes 542 and to the HDD memory devices 504, 505, 506. Although FIG. 5 shows a specific type of baffle duct extension 550 used, the present specification contemplates that any type of duct extension 550 described herein may be used along with those shown in FIG. 5.

Figure 6:
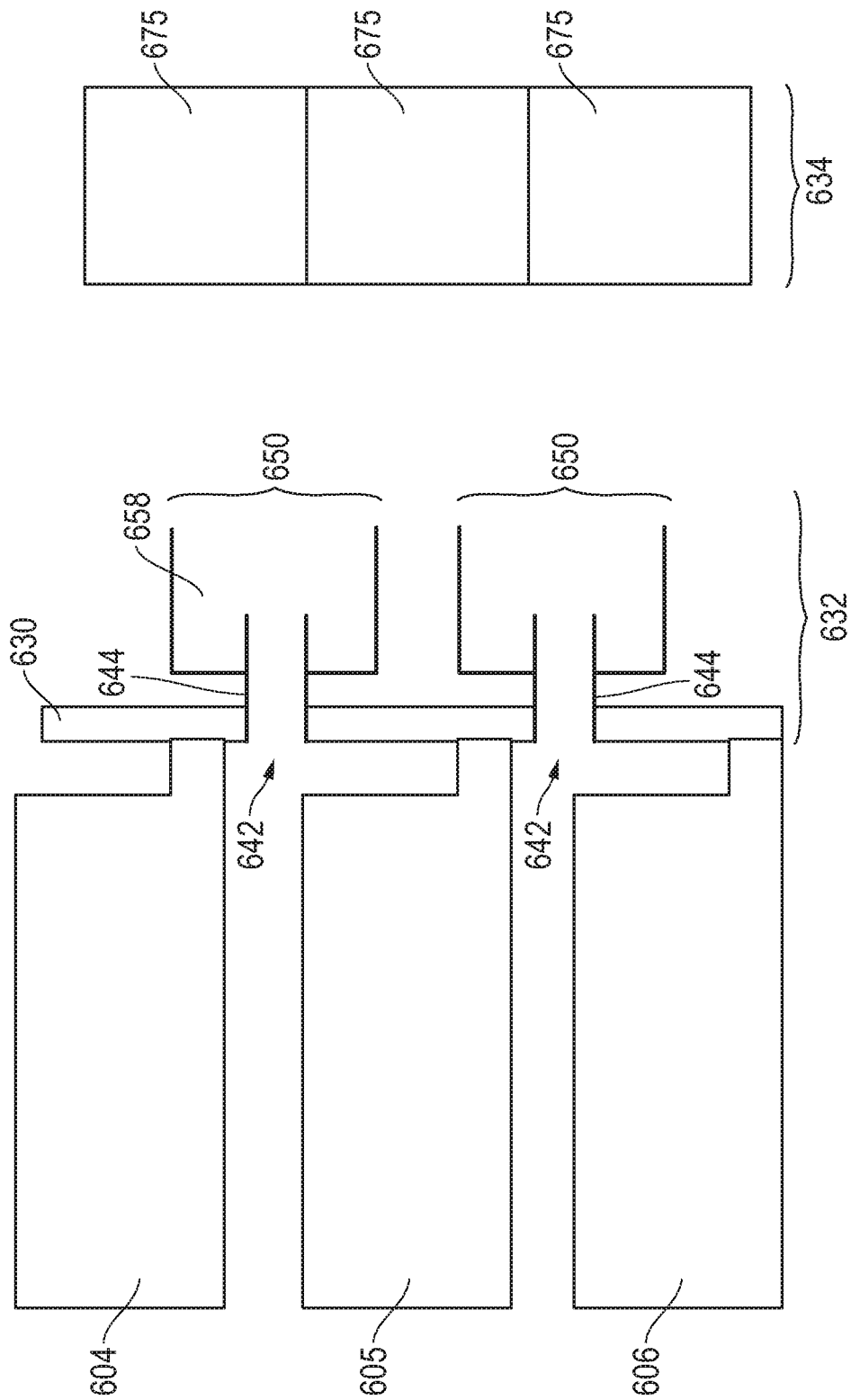
FIG. 6 is a block diagram of an airflow guide having a vertical backplane and duct extension in a portion of an information handling system with a cooling system according to another embodiment of the present disclosure.

FIG. 6 is a cross-section block diagram of an airflow guide 632 having a vertical backplane 630 with duct extension 650 according to another embodiment of the present disclosure. FIG. 6 shows a vertical backplane 630 with a number of walls 644 and duct extensions 650 coupled thereto. In an embodiment described herein, the number of walls 644 and duct extensions 650 may be selectively removeable from the vertical backplane 630. In an alternative embodiment, the number of walls 644 and duct extensions 650 and vertical backplane 630 may be formed into a monolithic piece. In yet an alternative embodiment, the number of walls 644 and duct extensions 650 may form part of an airflow guide plate (not shown) such as that described in connection with FIG. 3. In this embodiment, the airflow guide plate may be coupled to the vertical backplane 630 via a fastening device such as a clip or snap fit elements. Thus, although FIG. 6 shows a specific example where the number of walls 644 and duct extensions 650 and vertical backplane 630 are coupled together, the present specification contemplates those alternative embodiments shown and described in connection with FIGS. 2 and 3.

As with other aspects of the disclosure, the shown vertical backplane 630 may also include, in some embodiments, a planar support plate structure of an airflow guide plate attached to vertical backplane 630 to support one or more duct extensions 650 for an airflow guide 632 or support other acoustic dampening structures. Either a separate airflow guide plate or a vertical backplane 630 with one or more duct extensions 650 or other acoustic dampening structures attached are contemplated in embodiments herein. Each of the duct extensions 650 may include a number of walls 644 in yet another configuration embodiment that extends out away from the vertical backplane 630. The walls 644 may form a quarter-wave resonator duct extension 650.

In this embodiment in FIG. 6, the quarter-wave resonator duct extension 650 may acoustically attenuate acoustic energies at a specific frequency. In this example, where the frequencies produced by the airflow turbulence and/or the fan may dictate how long the walls 644 extend into an expansion part 658 of the quarter-wave resonator 650. This quarter-wave resonator 650 allows the airflow from the HDD memory devices 604, 605, 606 to pass through the vent holes 642, past the walls 644 that are selected to be a quarter of the length of a target acoustic frequency, and pass into the expansion chamber 658 of the quarter-wave resonator duct extension 650. The quarter-wave resonator duct extension 650 includes an exit point where the air may pass out of the quarter-wave resonator duct extension 650 to allow for sufficient airflow throughout the information handling system. Because the quarter-wave resonator duct extension 650 includes the walls 644 set to attenuate a specific frequency, acoustical energy created from the fans 675 of fan bank 634 and any turbulence created from the airflow exiting the quarter-wave resonator duct extension 650 may be prevented from passing towards the HDD memory devices 604, 605, 606. In this specific embodiment shown in FIG. 6, the selection of the quarter-wave resonator duct extension 650 may be based on anticipated or recorded frequencies actually experienced within the chassis of the information handling system.

In an embodiment, the quarter-wave resonator duct extension 650 and vent holes 642 may include an additional acoustic dampening device such as a layer of foam or other sound proofing material similar to that shown in FIG. 3. The foam may allow airflow to pass through the vent holes 642 but prevent acoustic energy from passing back through the vent holes 642 and to the HDD memory devices 604, 605, 606. Although FIG. 6 shows a specific type of quarter-wave resonator duct extension 650 used, the present specification contemplates that any type of duct extension 650 described herein may be used along with those shown in FIG. 6.

Figure 7:
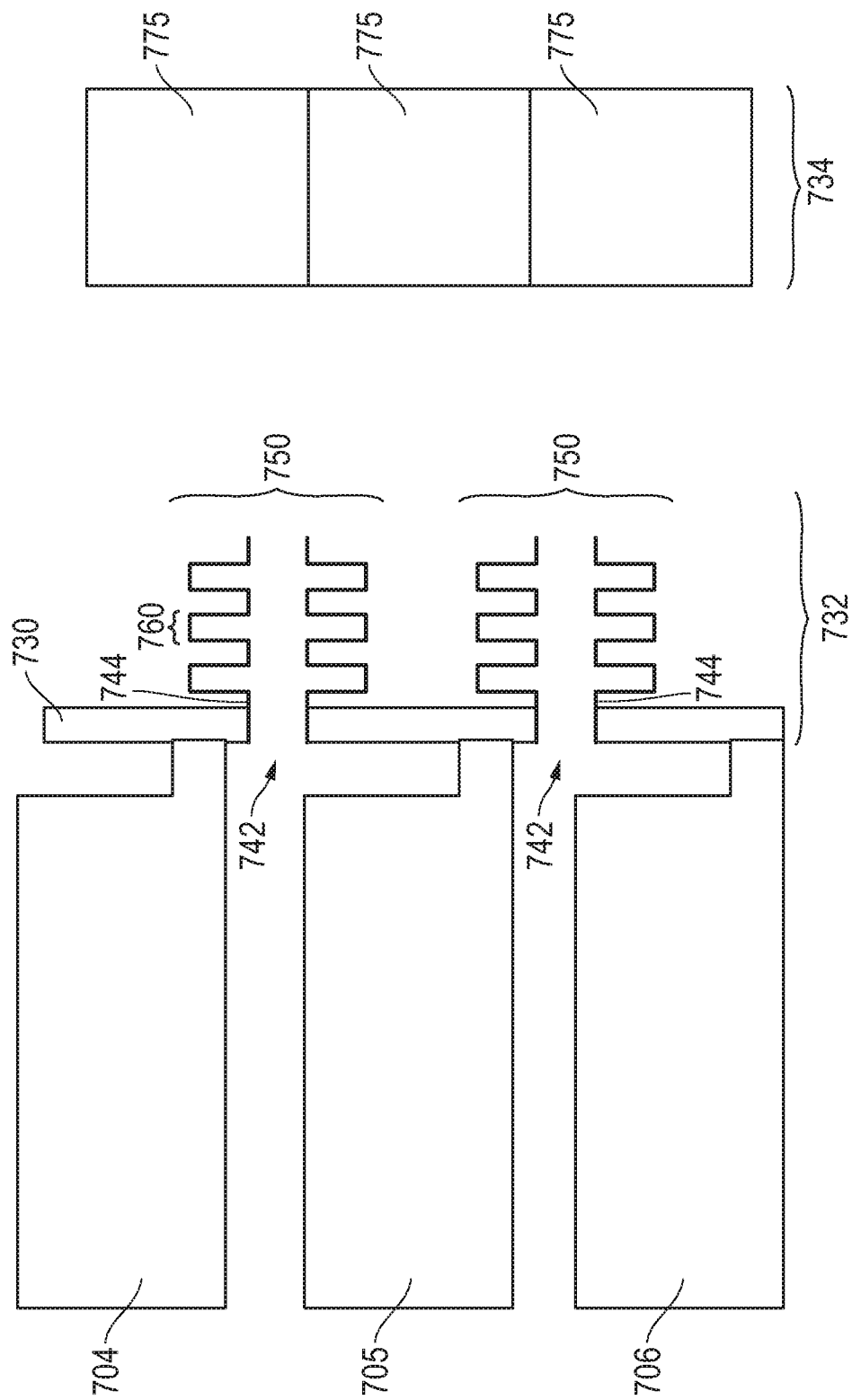
FIG. 7 is a block diagram of an airflow guide having a vertical backplane and duct extension in a portion of an information handling system with a cooling system according to another embodiment of the present disclosure.

FIG. 7 is a cross-section block diagram of an airflow guide 732 having a vertical backplane 730 and duct extension 750 according to another embodiment of the present disclosure. FIG. 7 shows a vertical backplane 730 with a number of walls 744 and duct extensions 750 coupled thereto. In an embodiment described herein, the number of walls 744 and duct extensions 750 may be selectively removeable from the vertical backplane 730. In an alternative embodiment, the number of walls 744 and duct extensions 750 and vertical backplane 730 may be formed into a monolithic piece. In yet an alternative embodiment, the number of walls 744 and duct extensions 750 may form part of an airflow guide plate (not shown) such as that described in connection with FIG. 3. In this embodiment, the airflow guide plate may be coupled to the vertical backplane 730 via a fastening device such as a clip or snap fit elements. Thus, although FIG. 7 shows a specific example where the number of walls 744 and duct extensions 750 and vertical backplane 730 are coupled together, the present specification contemplates those alternative embodiments shown and described in connection with FIGS. 2 and 3.

Each of the duct extensions 750 may include a number of walls 744 that extend out away from the vertical backplane 730. The walls 744 may be coupled to the duct extension 750. In an embodiment, the duct extension 750 may have walls 744 forming an aperture through the duct extension 750 that is sized and align with the aperture of a vent hole 742 or vent holes 742 in a backplane 730 to reduce generation of acoustic energy by airflow through those backplane vent holes 742. In some aspects, the duct extensions may open to one or more wider expander cavities or expansion chambers the aperture size of the backplane vent holes 742 in the example embodiment.

In this embodiment in FIG. 7, the duct extension 750 is in the form of a series of expansion chambers 760 in an expansion chamber duct extension 750. In this embodiment, the series of expansion chambers 760 may reduce the acoustic intensity of sounds or acoustic energy produced by the fans 775 or by airflow turbulence from the airflow exiting the back plane vent holes 742 into one or more of a series of expansion chambers 760. In this example, each of the series of expansion chambers 760 may be sized to baffle acoustic energy passing back through the series of expansion chambers 760 and to the HDD memory devices 704, 705, 706.

Again, in an embodiment, the expansion chamber duct extension 750 or vent holes 742 may include an additional acoustic dampening device such as a layer of foam or other sound proofing material similar to that shown in FIG. 3. The foam may allow airflow to pass through the vent holes 742 but prevent acoustic energy from passing back through the vent holes 742 and to the HDD memory devices 704, 705, 706. Although FIG. 7 shows a specific type of expansion chamber duct extension 750 used, the present specification contemplates that any type of acoustic device 750 described herein may be used along with those shown in FIG. 7.

Figure 8:
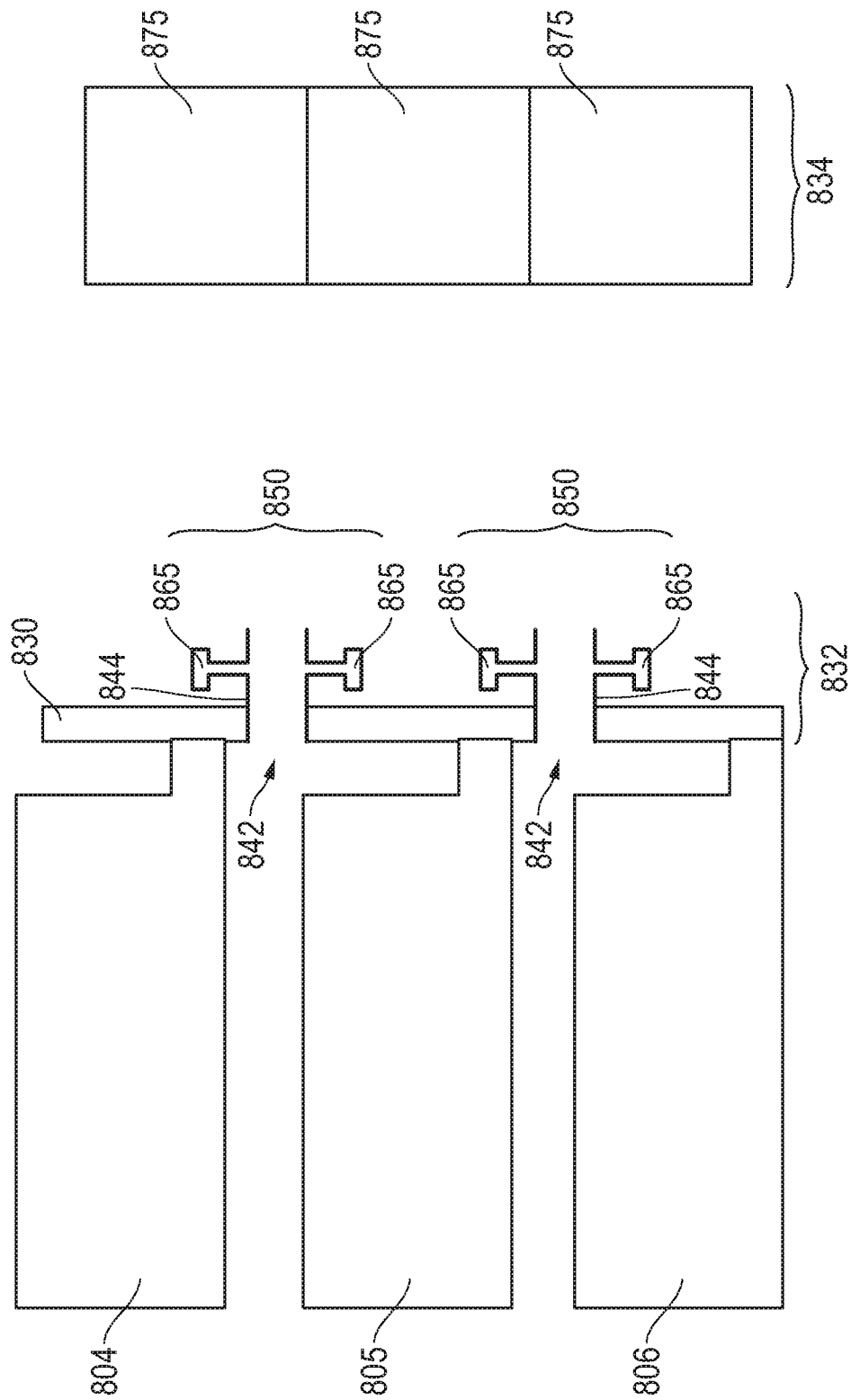
FIG. 8 is a block diagram of an airflow guide having a vertical backplane and duct extension in a portion of an information handling system with a cooling system according to another embodiment of the present disclosure.

FIG. 8 is a cross-section block diagram of an airflow guide 832 with a vertical backplane 830 and duct extension 850 according to another embodiment of the present disclosure. FIG. 8 shows a vertical backplane 830 with a number of walls 844 and duct extensions 850 coupled thereto. In an embodiment described herein, the number of walls 844 and duct extensions 850 may be selectively removeable from the vertical backplane 830. In an alternative embodiment, the number of walls 844 and duct extensions 850 and vertical backplane 830 may be formed into a monolithic piece. In yet an alternative embodiment, the number of walls 844 and duct extensions 850 may form part of an airflow guide plate (not shown) such as that described in connection with FIG. 3. In this embodiment, the airflow guide plate may be coupled to the vertical backplane 830 via a fastening device such as a clip or snap fit elements. Thus, although FIG. 8 shows a specific example where the number of walls 844 and duct extensions 850 and vertical backplane 830 are coupled together, the present specification contemplates those alternative embodiments shown and described in connection with FIGS. 2 and 3.

As with other aspects of the disclosure, the shown vertical backplane 830 may also include, in some embodiments, a planar support plate structure of an airflow guide plate attached to vertical backplane 830 to support one or more duct extensions 850 for an airflow guide 832 or support other acoustic dampening structures. Either a separate airflow guide plate or a vertical backplane 830 with one or more duct extensions 850 or other acoustic dampening structures attached are contemplated in embodiments herein. Each of the airflow guides 832 may include a number of walls 844 that extend out away from the vertical backplane 830 or airflow guide plate to form one or more Helmholtz chambers 865. The walls 844 may form an aperture of the duct extension 850 which may be sized in accord to the aperture dimension of the vent holes 842 at the backplane 830 or the planar airflow guide plate and then formed to create the one or more Helmholtz chambers 865 shown in cross-section in the present embodiment.

In this embodiment in FIG. 8, the duct extension 850 is in the form of one or more Helmholtz chambers 865 of a Helmholtz chamber duct extension 850. In this embodiment, the Helmholtz chambers 865 have a known volume such that, when airflow is passed through the airflow guide 832, undesirable frequencies of acoustic energy is reduced. In this specific embodiment, the frequency may be set to a frequency of the any frequencies of acoustic energy created by any air turbulence of airflow through vent holes 842, the operation of the fans 875, or any other acoustic energy created within the information handling system.

Again, in an embodiment, the duct extension 850 and vent holes 842 may include an additional acoustic dampening device such as a layer of foam or other sound proofing material similar to that shown in FIG. 3. The foam may allow airflow to pass through the vent holes 842 but prevent acoustic energy from passing back through the vent holes 842 and to the HDD memory devices 804, 805, 806. Although FIG. 8 shows a specific type of Helmholtz chamber duct extension 850 used, the present specification contemplates that any type of duct extension 850 described herein may be used along with those shown in FIG. 8.

Figure 9:
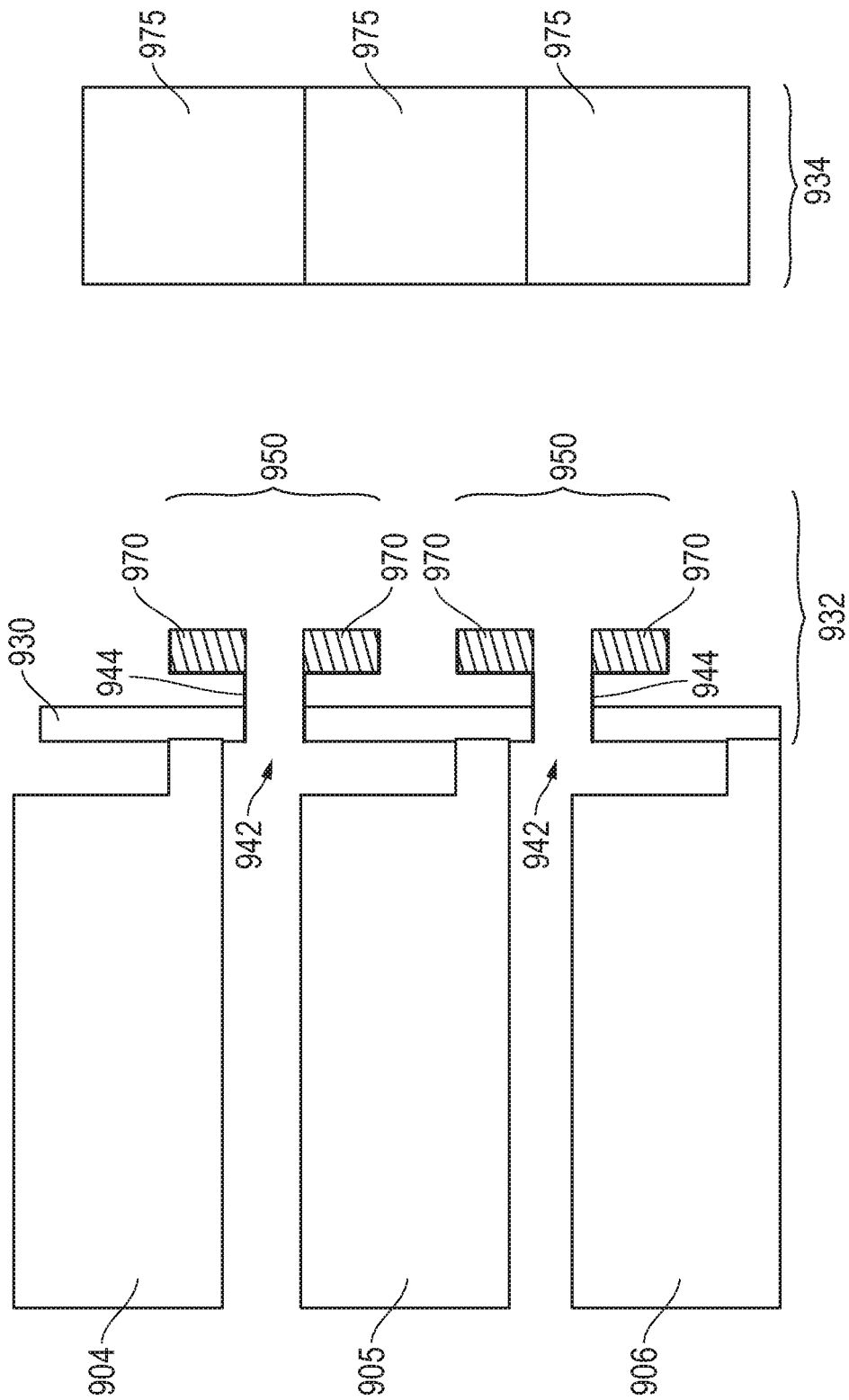
FIG. 9 is a block diagram of an airflow guide having a vertical backplane and duct extension in a portion of an information handling system with a cooling system according to another embodiment of the present disclosure.

FIG. 9 is a cross-section block diagram of an airflow guide 932 having a vertical backplane 930 and duct extension 950 according to another embodiment of the present disclosure. FIG. 9 shows a vertical backplane 930 with a number of walls 944 and duct extensions 950 coupled thereto. In an embodiment described herein, the number of walls 944 and duct extensions 950 may be selectively removeable from the vertical backplane 930. In an alternative embodiment, the number of walls 944 and duct extensions 950 and vertical backplane 930 may be formed into a monolithic piece. In yet an alternative embodiment, the number of walls 944 and duct extensions 950 may form part of an airflow guide plate (not shown) such as that described in connection with FIG. 3. In this embodiment, the airflow guide plate may be coupled to the vertical backplane 930 via a fastening device such as a clip or snap fit elements. Thus, although FIG. 9 shows a specific example where the number of walls 944 and duct extensions 950 and vertical backplane 930 are coupled together, the present specification contemplates those alternative embodiments shown and described in connection with FIGS. 2 and 3.

As with other aspects of the disclosure, the shown vertical backplane 930 may also include, in some embodiments, a planar support plate structure of an airflow guide plate attached to vertical backplane 930 to support one or more duct extensions 950 for an airflow guide 932 or support other acoustic dampening structures. Either a separate airflow guide plate or a vertical backplane 930 with one or more duct extensions 950 or other acoustic dampening structures attached are contemplated in embodiments herein. Each of the duct extensions 950 may include a number of walls 944 that extend out away from the vertical backplane 930. The walls 944 may form an aperture of the duct extension 950 which may be sized in accord to the aperture dimension of the vent holes 942 at the backplane 930 or the planar airflow guide plate and then formed to create the one or more expanded opening duct extensions shown in cross-section in the present embodiment.

In this embodiment in FIG. 9, the expanded opening duct extension 950 is in the form of an expanded opening in an embodiment that is of a greater aperture dimension in the expanded portion shown in cross-section than the aperture dimension of the vent holes 942 of the backplane 930. The expanded opening allows for the air passing through the duct extension 950 to expand and dissipate into the portion of the information handling system on the opposite side of the vertical wall 930 as the HDD memory devices 904, 905, 906. In one embodiment, the expanded opening portion of the duct extension 950 has an acoustic dampening material 970. This may provide for baffling or dampening turbulent acoustic energies with the acoustic dampening material 970. The acoustic dampening material 970 may be any material that dampens the acoustic energies that may otherwise pass through the vertical backplane 930 and to the HDD memory devices 904, 905, 906. In a specific embodiment, the acoustic dampening material 970 is foam. Again, FIG. 9 shows a specific type of duct extension 950 used, the present specification contemplates that any type of duct extension 950 described herein may be used along with those shown in FIG. 9.

Figure 10:
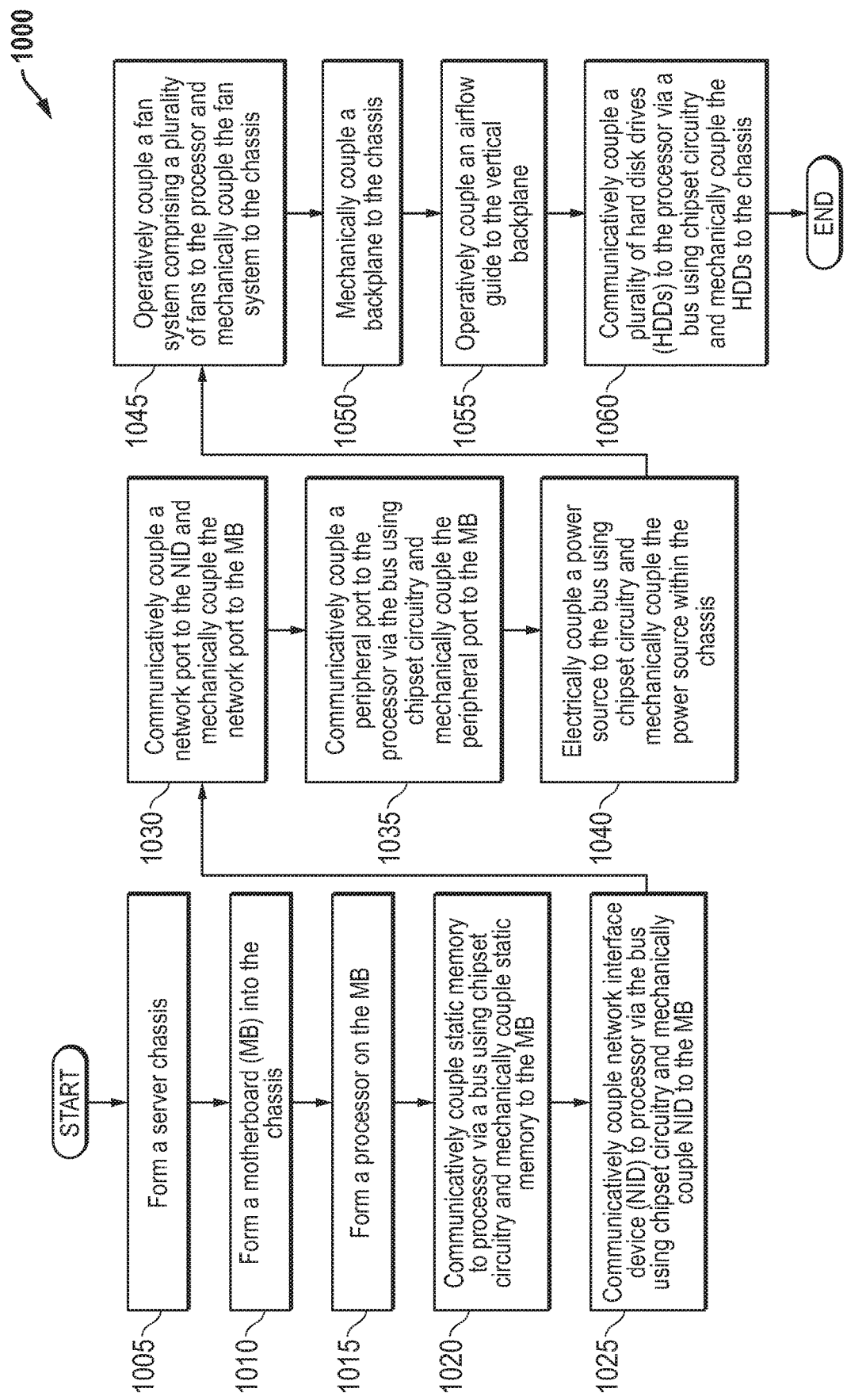
FIG. 10 is a flow diagram illustrating a method of forming a server information handling system according to an embodiment of the present disclosure.

FIG. 10 is a flow diagram illustrating a method 1000 of forming a server system according to an embodiment of the present disclosure. The method 1000 may include, at block 1005, forming a server chassis. The server chassis may be of any shape used to house the components of the information handling system such as those described in connection with FIG. 1. In an embodiment, the chassis is sized to fit any number of HDD memory devices, a motherboard, a power supply unit, a bank of fans, a vertical backplane, and any type of airflow guide as described herein. Additional components of the information handling system may be included within the chassis and the present specification contemplates that the chassis may be sized to fit any other type of components used to operate the information handling system. For example, the server chassis may be made of metal, plastic, or other suitable material to form walls and support to house structures and components of the information handling system of embodiments herein.

The method 1000 may also include forming the motherboard (MB) into the chassis at block 1010. The MB may be any type of motherboard to suit the computational, storage, and/or processing needs the information handling system is meant to be used for. As such the processor, chipset circuitry, RAM, ROM, and other devices formed on the MB may be selected to fit these needs as well as to fit within the chassis itself. The MB may be made of any type of printed circuit board with the chipset circuitry operatively coupling the components of the information handling system together including one or more processors, memory, data switching, and the like to the HDDs as described herein.

The method 1000 also includes forming a processor on the MB at block 1015. Again, the processor chosen may be dependent on the desired functionality of information handling system. A static memory may also be operatively coupled to the processor at block 1020 via a bus using the chip circuitry described herein. This formation of the processor on the MB may be, in an embodiment, carried out prior to the coupling of the MB into the chassis of the information handling system.

A network interface device (NID) may also be operatively coupled to the processor via the bus using the chipset circuitry at block 1025. The NID may also be mechanically coupled to the MB at block 1025 to secure the MD within the chassis and so that one or more ports associated with the NID may be made accessible to a user of the server. The network port may be communicatively coupled to the NID at block 1030 and also secured to the MB. The NID and NID port may be used to allow the information handling system, as a server, to access a computer network (WAN or LAN) and provide the processing, data, or software resources as described herein.

At block 1035, a peripheral port may be operatively coupled to the processor via the bus. The peripheral port may be operatively coupled to the bus via the chipset circuitry and also mechanically coupled to the MB to secure the peripheral port to the MB. The peripheral port may be situated on the MB for access by a user of the information handling system to couple a peripheral device to the information handling system.

A power source may then be electrically coupled to the processors, data switches, HDDs, cooling fans, and other components of the information handling system at block 1040. The power source may be electrically coupled to the components via power traces in the printed circuit board circuitry, power wire harnesses and other known means to supply power to components of the server information handling system. The power source may be mechanically coupled to the chassis to secure the power source therein via a transformer for connection to an outside power source and also may include one or more battery systems. In an embodiment, the power source may be electrically coupled to the MB. Additionally, in an embodiment, the power source may be electrically coupled to a bank of HDDs or other components via any number of edge connectors or 90-degree connectors via a backplane. As described herein, the power source may be any power supply unit that may include a battery and an AC power supply.

The method 1000 may include mechanically coupling a backplane to the chassis at block 1050. The backplane may also include circuitry to operatively couple the processor, data switches, power, and other components to a bank of HDD memory devices. The bank of HDD memory devices, or static drive memory devices may be attached via connectors to the printed circuit board of the backplane and may be removably inserted into slots to be placed within the chassis at the backplane of the server information handling system and coupled via connectors mounted on the backplane. The backplane may, in some embodiments, include a vertical backplane that physically separates the slotted bank of HDD memory devices from the other components of the information handling system such as the MB and a fan or bank of fans and permits easy access to the one or more HDD memory devices for replacement or service. The mounted connectors on the backplane may operably couple data communications and power from the other components of the server information handling system to the bank of HDD memory devices. In the event of a vertical backplane board for mounting the one or more HDD memory devices, this vertical backplane may act as a barrier to airflow through the server information handling system. In embodiments, one or more vent holes may be formed in the backplane to allow for airflow through the backplane and between the HDD memory devices to assist with temperature control of those devices and the server information handling system overall.

An airflow guide, as described herein, may be coupled to the vertical backplane at block 1055. In this embodiment, the airflow guide may be part of an airflow guide plate that is a separate piece apart from the vertical backplane. In an alternative embodiment, the vertical backplane may have individual airflow guides may attached to it at vent holes or formed as part of a monolithic piece with the vertical backplane. In some embodiments, the coupling of the airflow guide plate with one or more airflow guides alignable to vent holes in the vertical backplane may include the use of any coupling device such as a clip, a screw, a clamp, or other fastening device. In one specific embodiment, the airflow guide plate may snap fit to the vertical backplane. In another specific embodiment, the fastening devices used to couple the airflow guide to the vertical backplane may allow for the selection of any type of airflow guides on the airflow guide plate to be specially used with the server information handling system layout of a particular server build and similar to embodiments described herein and, in some examples specifically described in connection with FIGS. 3-8.

The method 1000 may also include, at block 1060, with communicatively coupling a plurality of HDD memory devices to the processor via a bus using the chipset circuitry, electrically coupling the HDD memory devices to a power source via the backplane, and mechanically coupling the HDD memory devices to the backplane which is mechanically coupled to the chassis. The number of HDD memory devices may vary based, not only on the intended used of the information handling system, but also the operating capabilities of the processor or any other components formed on the MB or otherwise operatively coupled to the information handling system. The communicative coupling of the HDDs to the processor, data switches, the NID, and the like, may be facilitated by a number of electrical connectors formed at the vertical backplane.

In some embodiments, the type of airflow guide placed between the HDD memory devices and the remaining portions of the information handling system may be dependent on the physical structures placed within the information handling system as well as any anticipated or measured acoustic energies produced within the chassis of the information handling system. Some example airflow guides may be more beneficial to reduce the amount of acoustic energy that reaches the HDD memory devices than others. Additionally, the airflow guide selected to be placed within the chassis of the information handling system may be dependent on the amount of airflow to be produced by the fan bank also placed within the chassis as well as the number of vent holes formed through the vertical backplane (and, accordingly, the number of airflow guides placed on the vertical backplane). If and when any given placed airflow guide does not sufficiently prevent acoustic energy from passing through the vent holes and to the HDD memory devices, the selective removability of the airflow guide plates allows for the modification of the both the airflow and the acoustic energy reduction properties within the chassis. A full redesign of the motherboard, vertical backplane, and HDD memory devices placement is not necessary. Still further, the selection of the airflow guides may be dependent on a target frequency of acoustic energy that would adversely affect the operation of the HDD memory devices and, specifically, the operation of the magnetic heads of the HDD memory devices.

As described herein, the duct extensions reduce acoustic energy in the range of 4 to 12 kHz region that is part of the frequencies of sound due to turbulence created by the airflow. Further, the airflow guide plate may have duct extensions with one or more passive acoustic dampening structure types according to embodiments herein that may only need limited extension from the vertical backplane. In one example embodiment, the duct extensions or other types of acoustic dampening devices may extend less than one centimeter from the vent holes in the vertical backplane. It is contemplated, however, that any length, size or shape of duct extensions or other acoustic dampening devices may be used and combinations acoustic dampening devices may be used with some embodiments. Additionally, the blades of the fans may create acoustic energy that also may be prevented from reaching the HDDs via the duct extensions. In an embodiment, the selection of the type, number, and size of the duct extensions may be based on detected acoustic energy present during operation of the information handling system.

The blocks of the flow diagram of FIG. 10 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A server information handling system, comprising: a processor; a network interface device (NID); a power source; a vertical backplane for providing electrical and data coupling to a plurality of hard disk drives (HDDs) operatively coupled to the vertical back plane; a plurality of vent holes formed through the vertical backplane; and an acoustic dampening device including a duct plate having duct plate vent holes with a plurality of duct extensions operatively coupled to and protruding away from at least a portion of the plurality of vent holes formed through the vertical backplane and at least a portion of the duct plate vent holes, where the duct extensions and the duct plate vent holes are sized to align with the vent holes at the vertical backplane; the duct extensions to acoustically separate a fan system of the server information handling system from the plurality of HDDs within the information handling system server by mitigation of acoustic energy transmission generated by airflow through the portion of the plurality of vent holes having aligned duct extensions.

2. The server information handling system of claim 1, wherein the duct extensions further include an aperture that flares away from the plurality of vent holes in the vertical backplane to control the velocity vector of airflow created by the fan system.

3. The server information handling system of claim 1, wherein the duct extensions further include a grating formed at each duct extension to re-direct airflow in a direction different from the airflow through the plurality of vent holes vertical backplane.

4. The server information handling system of claim 1, wherein the duct extensions further include:
   an aperture area that flares away from the vent holes in the vertical backplane; and
   a honeycomb-shaped grating formed at a terminal end of the flared duct extension aperture to dampen acoustic energy generated by the airflow through the vent holes in the vertical backplane.

5. The server information handling system of claim 1, wherein the duct extensions further include a quarter wave resonator.

6. The server information handling system of claim 1, wherein the duct extensions further include a plurality of expansion chambers to baffle the acoustic intensity caused by airflow through the vent holes and duct extension.

7. The server information handling system of claim 1, wherein the acoustical dampening device further includes a foam ring formed around an edge of the aperture of the duct extension.

8. The server information handling system of claim 1, wherein the duct extensions further include a serpentine baffle that allows airflow to pass through the vent holes and duct extensions while redirecting acoustic energy away from the vent holes and vertical backplane.

9. The server information handling system of claim 1, wherein the acoustic dampening device includes at least one fastener to couple the acoustic dampening device to the vertical backplane.

10. A server system, comprising: a motherboard including a processor; a network interface device (NID); a power supply unit; a fan system operatively coupled to the processor to create an airflow throughout the server system as part of a thermal control system; at least one hard disk drive (HDD) operatively coupled to the processor; a backplane physically separating the at least one HDD from the motherboard, processor, and fan system, the backplane including: data and power connectors for connectivity to the at least one HDD; a plurality of vent holes formed through the backplane; and a duct plate including a plurality of duct plate vent holes with a plurality of duct extensions operating as acoustic dampening devices, where the duct extensions are operatively coupled to the backplane via the duct plate and sized to align with the vent holes at the backplane and the duct extensions protrude away from the vent holes formed through the backplane and the duct plate vent holes where the duct extensions mitigate acoustic energy to the at least one HDD.

11. The server system of claim 10, further comprising: the duct extensions including a grating formed at a duct extension and proximate to at least one of the plurality of vent holes.

12. The server system of claim 10, further comprising:
the duct extensions are apertures that flare away from the backplane; and
a honeycomb-shaped grating formed at a terminal end of the duct extensions to mitigate acoustic energy from airflow through the vent holes in the backplane.

13. The server system of claim 10, wherein the duct extensions further comprise:
the duct extensions in a duct extension plate and at least one coupling device to couple the duct extension plate to the backplane such that the duct extensions are aligned with the plurality of vent holes.

14. The server system of claim 10, wherein the fan system creates an airflow from the at least one HDD to the processor.

15. The server system of claim 10, wherein the duct extensions protrude away from each of the plurality of vent holes normal to the surface of the backplane.

16. The server system of claim 10, wherein the backplane and duct extensions form a single monolithic piece.

17. A method of forming a server system, comprising forming a server chassis; coupling a power supply and a motherboard including a processor to the server chassis; mechanically coupling a fan system to the server chassis and operatively coupling the fan system to the power supply; mechanically coupling a backplane to the server chassis, the backplane physically separating HDD from the fan system, the backplane including a plurality of vent holes formed therethrough; mechanically coupling a hard disk drive (HDD) to the backplane that operatively couples the HDD to the processor; coupling an acoustic dampening device including a duct plate having a duct vent hole with a duct extension to the backplane sized to align with at least one of the plurality of vent holes at the backplane, the duct extension protruding away from the at least one of the plurality of vent holes and aligned duct vent hole in the duct plate.

18. The method of claim 17, further comprising: coupling the duct plate, via a fastener, with a plurality of duct vent holes with duct extensions to the backplane to align with the plurality of vent holes in the backplane.

19. The method of claim 17, wherein the duct extension further comprises a duct extension that includes a:
quarter wave resonator.

20. The method of claim 17, wherein the duct extension further comprises a duct extension that includes:
a serpentine baffle that allows airflow to pass through the vent holes and the duct extensions while reducing acoustic energy transmitted to the vent holes and backplane.

* * * * *